US011993678B2

(12) United States Patent
Uno

(10) Patent No.: US 11,993,678 B2
(45) Date of Patent: May 28, 2024

(54) POLYAMIC ACID, POLYAMIC ACID SOLUTION, POLYIMIDE, POLYIMIDE FILM, LAMINATE AND FLEXIBLE DEVICE, AND METHOD FOR PRODUCING POLYIMIDE FILM

(71) Applicant: KANEKA CORPORATION, Osaka (JP)

(72) Inventor: Mari Uno, Shiga (JP)

(73) Assignee: KANEKA CORPORATION, Osaka (JP)

( * ) Notice: Subject to any disclaimer, the term of this patent is extended or adjusted under 35 U.S.C. 154(b) by 842 days.

(21) Appl. No.: 17/039,383

(22) Filed: Sep. 30, 2020

(65) Prior Publication Data

US 2021/0024699 A1 Jan. 28, 2021

Related U.S. Application Data

(63) Continuation of application No. PCT/JP2019/010122, filed on Mar. 12, 2019.

(30) Foreign Application Priority Data

Mar. 30, 2018 (JP) ................................ 2018-069411

(51) Int. Cl.

*C08G 73/10* (2006.01)
*B32B 27/08* (2006.01)
*B32B 27/28* (2006.01)
*C08J 5/18* (2006.01)
*H01L 27/12* (2006.01)

(52) U.S. Cl.

CPC .......... *C08G 73/1067* (2013.01); *B32B 27/08* (2013.01); *B32B 27/281* (2013.01); *C08G 73/1014* (2013.01); *C08G 73/1032* (2013.01); *C08J 5/18* (2013.01); *H01L 27/1218* (2013.01)

(58) Field of Classification Search

CPC .... C08G 73/1042; C08G 73/1067; C08J 5/18; C08L 79/08

See application file for complete search history.

(56) References Cited

U.S. PATENT DOCUMENTS

2008/0138537 A1 6/2008 Simone et al.
2014/0228512 A1* 8/2014 Chou .................. C08G 73/106 524/600
2015/0183931 A1* 7/2015 Fujii .................... C09D 179/08 528/353
2016/0222165 A1* 8/2016 Wakita ................. H10K 50/844
2019/0048141 A1* 2/2019 Yun .................... C08G 73/1067

FOREIGN PATENT DOCUMENTS

JP 2007046054 A 2/2007
JP 2012-40836 A 3/2012
JP 2014152327 A 8/2014
JP 2015101710 * 6/2015
JP 2015101710 A 6/2015
JP 2015136868 A 7/2015
JP 2015-187987 A 10/2015
JP 2018-48307 A 3/2018
JP 2018053156 A 4/2018
WO 2014/007112 A1 1/2014
WO 2017/051827 A1 3/2017
WO 2018056573 A1 3/2018
WO 2019065523 A1 4/2019

OTHER PUBLICATIONS

International Search Report issued in corresponding International Application No. PCT/JP2019/010122; dated Jun. 11, 2019 (2 pages).
Written Opinion of the International Searching Authority issued in corresponding International Application No. PCT/JP2019/010122; dated Jun. 11, 2019 (5 pages).
Third party observation (Submission of Information) submitted in corresponding Japanese Patent Application No. 2020-509855 dated Oct. 28, 2022 (28 pages).
International Preliminary Report on Patentability issued in International Application No. PCT/JP2019/010122, dated Oct. 15, 2020 (10 pages).
Notice of Reasons for Refusal issued in corresponding Japanese Application No. 2023-102154 mailed Mar. 19, 2024 (8 pages).

* cited by examiner

*Primary Examiner* — Gregory Listvoyb
(74) *Attorney, Agent, or Firm* — Osha Bergman Watanabe & Burton LLP

(57) ABSTRACT

A polyamic acid that is a polyaddition reaction product of a diamine and a tetracarboxylic dianhydrides, according to one or more embodiments of the present invention. The polyamic acid contains 2'-bistrifluoromethylbenzidine as a diamine component in addition to 3,3',4,4'-biphenyltetracarboxylic dianhydride and 9,9'-(3,4'-dicarboxyphenyl)fluorenic dianhydride as tetracarboxylic dianhydride components. The polyamic acid may include 9,9'-(3,4'-dicarboxyphenyl)fluorenic dianhydride in an amount ranging from 0.5 mol % or more to 10 mol % or less based on total amount of the tetracarboxylic anhydride.

16 Claims, No Drawings

POLYAMIC ACID, POLYAMIC ACID SOLUTION, POLYIMIDE, POLYIMIDE FILM, LAMINATE AND FLEXIBLE DEVICE, AND METHOD FOR PRODUCING POLYIMIDE FILM

TECHNICAL FIELD

One or more embodiments of the present invention relate to polyamic acid, polyamic acid solution, polyimide, and polyimide film. Further, the present invention relates to a laminate and flexible device that include the polyimide film.

BACKGROUND

Electronic devices such as displays, solar cells, and touch panels are required to be thin, lightweight and flexible, and use of plastic film substrates instead of glass substrates is under consideration.

In the process for producing these electronic devices, electronic elements such as a thin-film transistor and a transparent electrode are disposed on the substrate. Since formation of an electronic element requires a high temperature process, the plastic film substrate is required to have heat resistance allowing the substrate to adapt to a high-temperature process. When an electronic element mainly composed of an inorganic material is formed on the plastic film substrate, stress may be generated at an element-formed interface due to a difference in coefficient of thermal expansion between the inorganic material and the plastic film substrate, resulting in warpage of the substrate and breakage of the element. Thus, a material having heat resistance, and a coefficient of thermal expansion equivalent to that of an inorganic material is required. When light emitted from the element exits through the plastic film substrate (for example, a bottom emission type organic EL), the substrate material is required to have transparency.

As a plastic material having high transparency and a low thermal expansion property, polyimide using a monomer having a rigid structure is known (Patent Document 1). Patent Document 2 discloses a method in which a release layer is disposed on a glass base substrate (support), and a polyimide precursor is applied onto the release layer, and imidized by heating to prepare a polyimide film substrate for a flexible electronic device. Patent Document 3 suggests that a polyimide film having high transparency and a low coefficient of thermal expansion can be obtained by adding an imidazole-based compound to a fluorine atom-containing polyimide acid solution to perform imidization.

PATENT DOCUMENTS

Patent Document 1: Japanese Patent Laid-open Publication No. 2007-046054

Patent Document 2: Japanese Patent Laid-open Publication No. 2015-136868

Patent Document 3: Japanese Patent Laid-open Publication No. 2015-101710

SUMMARY

Polyimide, which is made transparent by shortening the absorption wavelength through molecular design, has a high visible light transmittance, but film-shaped polyimide may have a large haze, and hence poor suitability as a substrate material for displays etc. Generally, polyimide has a trade-off relationship between transparency and the coefficient of thermal expansion, and the coefficient of thermal expansion tends to increase when the transparency is enhanced. Patent Document 3 shows an example in which by adding an imidazole-based compound, the coefficient of thermal expansion is reduced to 15 ppm/K while the transparency of the polyimide is maintained, but a lower thermal expansion property and higher heat resistance are required for practical use as a substrate for a flexible electronic device. In view of the above-described circumstances, one or more embodiments of the present invention is to provide a polyimide having high heat resistance (high glass transition temperature), a low thermal expansion property and high transparency (particularly a low haze), and a polyamic acid to be used for forming the polyimide.

A polyamic acid according to one or more embodiments of the present invention is a polyaddition reaction product of a diamine and a tetracarboxylic dianhydride, and contains 2,2'-bistrifluoromethylbenzidine as a diamine component, and 3,3',4,4'-biphenyltetracarboxylic dianhydride and 9,9'-(3,4'-dicarboxyphenyl)fluorenic dianhydride as tetracarboxylic dianhydride components. The amount of 9,9'-(3,4'-dicarboxyphenyl)fluorenic dianhydride based on the total amount of the tetracarboxylic anhydrides may be 0.5 mol % or more, 1 mol % or more and 10 mol % or less.

Pyromellitic anhydride may be further contained as a tetracarboxylic anhydride component. The amount of pyromellitic anhydride based on the total amount of the tetracarboxylic anhydrides is, for example, 10 mol % or more and 50 mol % or less.

The polyamic acid can also be provided as a solution of polyamic acid in an organic solvent. The polyamic acid solution may contain imidazole compound. The content of the imidazole compound in the polyamic acid solution may be 0.10 mole or less based on 1 mole of the amide group of the polyamic acid.

A polyimide can be obtained by imidizing the polyamic acid. The polyimide may be formed as a polyimide film. For example, a polyamic acid solution is applied to a base substrate to form a laminate with a film-shaped polyamic acid disposed on the substrate, and by heating the laminate, the polyamic acid is imidized to form a polyimide film. The maximum heating temperature of the laminate is, for example, 380° C. or higher and 500° C. or lower. The heating time in this temperature range is 10 minutes or more and 60 minutes or less.

One or more embodiments of the present invention are a laminate with the polyimide film disposed on a base substrate. One or more embodiments of the present invention are a flexible device having an electronic element on the polyimide film.

Laser irradiation may be performed in peeling of the polyimide film from the base substrate. The glass transition temperature of the polyimide film may be 380° C. or higher. The coefficient of thermal expansion of the polyimide film during heating from 100° C. to 400° C. may be 100 ppm/K or less. The light transmittance of the polyimide film at a wavelength of 450 nm may be 75% or more, and the haze of the polyimide film may be 1.2% or less.

The polyimide film of one or more embodiments of the present invention is excellent in thermal dimensional stability and transparency and suitable for a substrate for a flexible device.

DETAILED DESCRIPTION OF THE EMBODIMENTS

A polyamic acid can be obtained by polyaddition reaction of a tetracarboxylic dianhydride with a diamine, and a polyimide can be obtained by cyclodehydration reaction of the polyamic acid. In other words, polyimide is a polycondensation reaction product of the tetracarboxylic dianhydride with the diamine. The polyamic acid and the polyimide of the present invention contain 2,2'-bistrifluoromethylbenzidine (hereinafter, sometimes referred to as TFMB) as a diamine component, and 3,3,4,4-biphenyltetracarboxylic dianhydride (hereinafter, sometimes referred to as BPDA) and 9,9'-(3,4'-dicarboxyphenyl)fluorenic dianhydride (hereinafter, sometimes referred to as BPAF) as tetracarboxylic dianhydride components. The polyamic acid and the polyimide may further contain pyromellitic anhydride (hereinafter, sometimes referred to as PMDA) as a tetracarboxylic dianhydride component.

(Tetracarboxylic Dianhydride Component)

A polyimide containing BPDA as a tetracarboxylic dianhydride component has a low thermal expansion property because BPDA has a rigid structure. The ratio of BPDA based on a total of 100 mol % of the tetracarboxylic dianhydride components in the polyamic acid and the polyimide may be 40 mol % or more, 45 mol % or more, or 50 mol % or more. The ratio of BPDA may be 99.5 mol % or less, 99 mol % or less, 95 mol % or less, 90 mol % or less, 85 mol % or less, or 80 mol % or less.

When PMDA is contained in addition to BPDA as the tetracarboxylic dianhydride component, the polyimide tends to have higher heat resistance and a lower thermal expansion property. The ratio of PMDA based on a total of 100 mol % of the tetracarboxylic dianhydride components in the polyamic acid and the polyimide may be 10 mol % or more and 50 mol % or less, 20 mol % or more and 50 mol % or less, 25 mol % or more and 50 mol % or less. When the ratio of PMDA is 10 mol % or more, the polyimide film tends to have a low thermal expansion property, and when the ratio of PMDA is 50 mol % or less, the polyimide film tends to have high transparency. For a high transparency of the polyimide film, the ratio of PMDA may be lower than the ratio of BPDA.

BPDA and PMDA have a rigid structure, and therefore when a polyimide film is prepared from a polyamic acid containing only BPDA and PMDA as tetracarboxylic dianhydride components, white turbidity resulting from crystallization or the like easily occurs. When BPAF is contained in addition to BPDA (and PMDA) as the tetracarboxylic dianhydride, white turbidity tends to be suppressed to obtain a polyimide film having excellent transparency. The ratio of BPAF based on a total of 100 mol % of the tetracarboxylic dianhydride components in the polyamic acid and the polyimide may be 0.5 mol % or more and 10 mol % or less, 1 mol % or more and 7 mol % or less, 2 mol % or more and 6 mol % or less, or 3 mol % or more and 5 mol % or less. When the ratio of BPAF is 0.5 mol % or more, crystallization of the polyimide tends to be suppressed, leading to suppression of white turbidity of the polyimide film. Since crystallization is suppressed, a dimensional change resulting from phase transition at the time of heating tends to hardly occur, leading to a decrease in coefficient of thermal expansion of the polyimide film. When the ratio of BPAF is 10 mol % or less, the low thermal expansion property can be maintained.

From the viewpoint of achieving both the high transparency and the low thermal expansion property, the total amount of PMDA, BPDA and BPAF based on a total of 100 mol % of the tetracarboxylic dianhydride components in the polyamic acid and the polyimide may be 90 mol % or more, 92 mol % or more, or 95 mol % or more.

The polyamic acid and the polyimide may contain a component other than PMDA, BPDA and BPAF as a tetracarboxylic dianhydride component. Examples of the other tetracarboxylic dianhydride include 3,3',4,4'-benzophenonetetracarboxylic dianhydride, 2,3,3',4'-biphenyltetracarboxylic dianhydride, 3,3',4,4'-diphenylsulfonetetracarboxylic dianhydride, 1,4,5,8-naphthalenetetracarboxylic dianhydride, 2,3,6,7-naphthalenetetracarboxylic dianhydride, 1,2,5,6-naphthalenetetracarboxylic dianhydride, 4,4'-oxydiphthalic anhydride, 9,9'-bis[4-(3,4-dicarboxyphenoxy)phenyl] fluorene dianhydride, 3,3',4,4'-biphenyl ether tetracarboxylic dianhydride, 2,3,5,6-pyridinetetracarboxylic dianhydride, 3,4,9,10-perylenetetracarboxylic dianhydride, 4,4'-sulfonyldiphthalic dianhydride, paraterphenyl-3,4,3',4'-tetracarboxylic dianhydride, metaterphenyl-3,3',4,4'-tetracarboxylic dianhydride, 3,3',4,4'-diphenyl ether tetracarboxylic dianhydride, (1S,2R,4S,5R)-cyclohexanetetracarboxylic dianhydride (cis, cis, cis-1,2,4,5-cyclohexanetetracarboxylic dianhydride), (1S,2S, 4R, 5R)-cyclohexanetetracarboxylic dianhydride, (1R,2S, 4S, 5R)-cyclohexanetetracarboxylic dianhydride, bicyclo[2.2.2]octane-2,3,5,6-tetracarboxylic dianhydride, bicyclo[2.2.2]oct-7-ene-2,3,5,6-tetracarboxylic dianhydride, 5-(dioxotetrahydrofuryl-3-methyl-3-cyclohexene-1,2-dicarboxylic anhydride, 4-(2,5-dioxotetrahydrofuran-3-yl)-tetralin-1,2-dicarboxylic anhydride, tetrahydrofuran-2,3,4,5-tetracarboxylic dianhydride, bicyclo-3,3',4,4'-tetracarboxylic dianhydride, 1,2,3,4-cyclopentanetetracarboxylic dianhydride, 1,2,3,4-cyclobutanetetracarboxylic dianhydride, 1,3-dimethyl-1,2,3,4-cyclobutanetetracarboxylic dianhydride, and 1,4-dimethyl-1,2,3,4-cyclobutanetetracarboxylic dianhydride.

(Diamine Component)

The polyimide film containing TFMB as a diamine component tends to have high transparency and a low coefficient of thermal expansion. From the viewpoint of achieving both the high transparency and the low thermal expansion property, the amount of TFMB based on a total of 100 mol % of diamine components in the polyamic acid and the polyimide may be 90 mol % or more, 95 mol % or more, or 99 mol % or more.

The polyamic acid and the polyimide may contain a component other than TFMB as the diamine component. Examples of the diamine other than TFMB include 4,4'-diaminobenzanilide, p-phenylenediamine, m-phenylenediamine, 3,4'-diaminodiphenyl ether, 4,4'-diaminodiphenyl ether, 4,4'-diaminodiphenyl sulfone, 3,3'-diaminodiphenyl sulfone, 9,9'-(4-aminophenyl)fluorene, 9,9'-(4-amino-3-methylphenyl)fluorene, 1,4'-bis(4-aminophenoxy)benzene, 2,2'-bis(4-aminophenoxyphenyl)propane, 4,4'-bis(4-aminophenoxy)biphenyl, 4,4'-methylenebis(cyclohexanamine), 3,3-diamino-4,4-dihydroxydiphenyl sulfone, and 2,2-bis(3-amino-4-hydroxyphenyl)hexafluoropropane.

When a flexural diamine such as silicone diamine is contained as the diamine component, the coefficient of thermal expansion of the polyimide film tends to increase. Thus, the amount of the flexural diamine based on a total of 100 mol % of diamine components in the polyamic acid and the polyimide may be 5 mol % or less, 1 mol % or less, or 0.5 mol % or less. From the viewpoint of reducing the coefficient of thermal expansion, it is preferable that the flexural diamine is not contained.

(Polyamic Acid and Polyamic Acid Solution)

The polyamic acid of one or more embodiments of the present invention can be synthesized by a known general method. For example, a polyamic acid solution can be obtained by reacting a diamine with a tetracarboxylic dianhydride in an organic solvent. The organic solvent to be used for polymerization of the polyamic acid may be one that dissolves the tetracarboxylic dianhydride and the diamine as monomer components, and dissolves the polyamic acid produced by polyaddition. Examples of the organic solvent include urea-based solvents such as tetramethylurea and N,N-dimethylethylurea; sulfone-based solvents such as dimethyl sulfoxide, diphenyl sulfone and tetramethyl sulfone; amide-based solvents such as N,N-dimethylacetamide, N,N-dimethylformamide, N,N'-diethylacetamide, N-methyl-2-pyrrolidone and hexamethylphosphoric triamide; ester-based solvents such as γ-butyrolactone; alkyl halide-based solvents such as chloroform and methylene chloride; aromatic hydrocarbon-based solvents such as benzene and toluene; phenol-based solvents such as phenol and cresol; ketone-based solvents such as cyclopentanone; and ether-based solvents such as tetrahydrofuran, 1,3-dioxolane, 1,4-dioxane, dimethyl ether, diethyl ether and p-cresol methyl ether. These solvents are normally used singly, and if necessary, two or more thereof may be used in combination as appropriate. For enhancing the solubility and the reactivity of the polyamic acid, the organic solvent may be selected from the group consisting of an amide-based solvent, a ketone-based solvent, an ester-based solvent and an ether-based solvent, and in particular, an amide-based solvent such as N,N-dimethylacetamide, N,N-dimethylformamide, N,N'-diethylacetamide or N-methyl-2-pyrrolidone.

The molecular weight of the polyamic acid can be adjusted by adjusting the ratio between the total number of moles of the diamine components and the total number of moles of the tetracarboxylic dianhydride components. The monomer component to be used in synthesis of the polyamic acid may contain a substance other than a diamine and a tetracarboxylic dianhydride by adjusting the ratio of the total number of moles of the diamine components to the total number of moles of the tetracarboxylic dianhydride components. For example, a monofunctional amine or a monofunctional acid anhydride may be used for the purpose of, for example, adjusting the molecular weight.

In one or more embodiments, synthesis of the polyamic acid by polyaddition of the diamine and the tetracarboxylic dianhydride is carried out in an inert atmosphere of argon, nitrogen or the like. When the diamine and the tetracarboxylic dianhydride are dissolved and mixed in an organic solvent in an inert atmosphere, polymerization proceeds. The order of adding the diamine and the tetracarboxylic dianhydride is not particularly limited. For example, the diamine may be dissolved or dispersed in a slurry form in an organic solvent to obtain a diamine solution, followed by adding the tetracarboxylic dianhydride to the diamine solution. The tetracarboxylic dianhydride may be added in a solid state, or added in a state of being dissolved or dispersed in a slurry form in an organic solvent.

The reaction temperature condition is not particularly limited. The reaction temperature may be 80° C. or lower from the viewpoint of suppressing a decrease in molecular weight of the polyamic acid due to depolymerization. The reaction temperature may be 0 to 50° C. from the viewpoint of causing polymerization reaction to moderately proceed. The reaction time may be arbitrarily set within the range of 10 minutes to 30 hours.

The weight average molecular weight of the polyamic acid of one or more embodiments of the present invention may be in the range of 10,000 to 200,000, in the range of 30,000 to 180,000, or in the range of 40,000 to 150,000. When the weight average molecular weight is 10,000 or more, the strength of the polyimide film can be secured. When the weight average molecular weight of the polyamic acid is 200,000 or less, the polyamic acid has sufficient solubility in a solvent, so that a coating film or a film having a smooth surface and a uniform thickness can be easily obtained. The molecular weight is a value calculated in terms of polyethylene glycol, which is obtained by gel permeation chromatography (GPC).

A polyamic acid solution can be obtained by reacting a diamine with a tetracarboxylic dianhydride in an organic solvent. A solvent may be added to the polyamic acid solution to adjust the polyamic acid concentration (solid content concentration of the solution). The polyamic acid solution may contain an additive aimed at, for example, promoting imidization by cyclodehydration of the polyamic acid and improving solution storability (pot life) by suppressing imidization.

In one or more embodiments, the polyamic acid solution of the present invention contains imidazole compound. When the polyamic acid solution contains imidazole compound, the thermal dimensional stability of a polyimide film obtained by thermal imidization of the polyamic acid tends to be improved, leading to a decrease in coefficient of thermal expansion. The imidazole compound is a compound containing a 1,3-diazole ring structure, and examples thereof include 1H-imidazole, 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole and 1-benzyl-2-phenylimidazole. Further, examples of the imidazole include 1,2-dimethylimidazole, 1-benzyl-2-methylimidazole and 1-benzyl-2-phenylimidazole. Among these, 1,2-dimethylimidazole and 1-benzyl-2-methylimidazole are preferable from the viewpoint of improving the thermal dimensional stability of the polyimide film.

The content of imidazole compound in the polyamic acid solution may be 0.005 to 0.1 mole, 0.01 to 0.08 mole, or 0.015 to 0.050 mole based on 1 mole of amide groups of the polyamic acid. The "amide group of polyamic acid" is an amide group generated by polyaddition reaction of a diamine with a tetracarboxylic dianhydride, and the polyamic acid obtained by polyaddition of 1 mole of diamine and 1 mole of tetracarboxylic dianhydride contains 2 moles of amide groups.

Although the reason why addition of imidazole compound to the polyamic acid solution improves the thermal dimensional stability of the polyimide film is unknown, it is supposed that the imidazole compound promote imidization by cyclodehydration of the polyamic acid, so that imidization easily proceeds, resulting in improvement of thermal dimensional stability. When the solvent remains in the film at a low temperature, the polymer chain has moderate mobility, and when imidization proceeds in this state, the orientation of the polymer is fixed in a rigid conformation with high stability. This is supposed to be a cause of improving thermal dimensional stability.

A polyamic acid containing PMDA, BPDA and BPAF as tetracarboxylic dianhydride components and TFMB as a diamine component gives a polyimide film having a sufficiently small coefficient of thermal expansion after thermal imidization even when the amount of imidazole compound contained in the solution is 0.1 equivalents or less based on the amount of amide groups. Since the addition amount of the imidazole is small, imidization in a solution storage state is suppressed, so that the stability of the polyamic acid solution can be improved. In addition, the transparency tends to be improved due to reduction of the amount of imidazole compound remaining in the polyimide film. Thus, for obtaining a polyimide film having a low thermal expansion property, the content of imidazole compound based on the amount of amide groups of the polyamic acid may be 0.005 equivalents or more.

The method for preparing a polyamic acid solution containing imidazole compound is not particularly limited. Imidazole compound may be added to a polyamic acid solution obtained by polymerization of a tetracarboxylic dianhydride and a diamine in an organic solvent, or imidazole compound may be added to a solution before or during the polymerization reaction. When imidazole compound is contained in the reaction system, the tetracarboxylic dianhydride may be ring-opened, leading to reduction of reactivity with the diamine. Thus, from the viewpoint of controlling the molecular weight of the polyamic acid, a method is preferable in which imidazole compound is added to the polyamic acid solution obtained by polymerization of the tetracarboxylic dianhydride and the diamine. The imidazole compound may be added to the polyamic acid as they are, or the imidazole compound mixed with a solvent in advance may be added to the polyamic acid.

Various organic or inorganic low-molecular-weight or high-molecular-weight compounds may be blended for imparting processing characteristics and various functionalities to the polyamic acid and the polyimide. For example, the polyamic acid solution may contain a dye, a surfactant, a leveling agent, a plasticizer, fine particles, a sensitizer, a silane coupling agent and the like. The fine particles may be organic fine particles or inorganic fine particles, and may be porous or hollow.

By blending a silane coupling agent with the polyamic acid solution, adhesion between the base substrate and a coating film of the polyamic acid and a polyimide film formed by cyclodehydration tends to be improved. The blending amount of the silane coupling agent may be 1.0 part by weight or less, 0.5 parts by weight or less, or 0.1 parts by weight or less, based on 100 parts by weight of the polyamic acid. The blending amount of the silane coupling agent blended for the purpose of, for example, improving improvement adhesion with the base substrate may be 0.01 parts by weight or more based on 100 parts by weight of the polyamic acid. The silane coupling agent may be added to the polyamic acid solution, or added to the solution of the polyamic acid before or during the polymerization reaction. For example, use of a silane coupling agent having an amino group enables introduction of a silane coupling agent-derived structure at the end of the polyamic acid. When a silane coupling agent having an amino group is added to the polyamic acid polymerization system, the blending amount of the silane coupling agent may be 1.0 part by weight or less based on 100 parts by weight of the polyamic acid (total of the tetracarboxylic dianhydride and the diamine) for ensuring that the molecular weight of the polyamic acid is kept high.

(Polyimide and Polyimide Film)

The above-described polyamic acid and polyamic acid solution may be used as materials for preparing products or members, or a binder resin, additives and the like may be blended to prepare a resin composition. For obtaining excellent heat resistance and mechanical properties, the polyamic acid may be imidized by cyclodehydration, and used as a polyimide. The cyclodehydration is performed by an azeotropic method using an azeotropic solvent, a thermal method or a chemical method. In a case where the imidization is performed in a solution state, chemical imidization may be performed with an imidizing agent and/or a dehydration catalyst added to the polyamic acid solution. In a case where the solvent is removed from the polyamic acid solution to form a film-shaped polyamic acid followed by imidization of the film-shaped polyamic acid, thermal imidization is preferable. For example, glass, a silicon wafer, a metal plate such as a copper plate or an aluminum plate, or a film base substrate of polyethylene terephthalate (PET) may be coated with a polyamic acid solution to form a coating film, and then heat-treated.

The base substrate can be coated with the polyamic acid solution by a known method such as a gravure coating method, a spin coating method, a silk screen method, a dip coating method, a bar coating method, a knife coating method, a roll coating method or a die coating method. The heating temperature and heating time for imidization may be appropriately determined. The heating temperature is within the range of, for example, 80° C. to 500° C.

Since the polyimide of one or more embodiments of the present invention is excellent in transparency and thermal dimensional stability, the polyimide can be used as a transparent substrate for replacement of glass, and is expected to come into use for TFT substrate materials, transparent electrode substrate materials, printed products, color filters, flexible display members, antireflection films, holograms, building materials, structures and the like. In particular, the polyimide film of one or more embodiments of the present invention is excellent in thermal dimensional stability, and is therefore suitably used as an electronic device transparent substrate such as a TFT substrate or an electrode substrate. Examples of the electronic device include image display devices such as liquid crystal display devices, organic ELs and electronic papers; touch panels and solar cells. In these applications, the thickness of the polyimide film may be about 1 to 200 μm, or about 5 to 100 μm.

In the process for producing an electronic device, electronic elements such as a thin-film transistor and a transparent electrode are disposed on the substrate. The process for forming elements on the film substrate is classified into a batch type and a roll-to-roll type. In the roll-to-roll process, electronic elements are sequentially disposed on a film substrate while a long film substrate is conveyed. In the batch process, a film substrate is formed on a rigid base substrate such as an alkali-free glass to prepare a laminate, electronic elements are disposed on the film substrate of the laminate, and the base substrate is then peeled from the film substrate. The polyimide film of one or more embodiments of the present invention is applicable to any process. The batch process has a cost advantage because existing equipment for glass substrates can be diverted. One example of a method for producing a polyimide film via a laminate with a polyimide film disposed on a glass base substrate will be described below.

First, a polyamic acid film is obtained by coating a base substrate with a polyamic acid solution to form a coating film of the polyamic acid solution, and heating a laminate of the base substrate and the coating film at a temperature of 40 to 200° C. for 3 to 120 minutes to remove the solvent. The drying may be performed at two or more set temperatures. For example, the drying is performed at 50° C. for 30 minutes, and then at 100° C. for 30 minutes. By heating the laminate of the base substrate and the polyamic acid film, the polyamic acid is subjected to cyclodehydration to cause imidization. The heating for imidization is performed at a temperature of, for example, 200 to 500° C., and the heating time is, for example, 3 minutes to 300 minutes. In one or more embodiments, the heating for imidization is performed by gradually increasing the temperature from a low temperature to a maximum temperature. The heating rate may be 2 to 10° C./minute, or 4 to 10° C./minute. The maximum temperature may be 380 to 500° C., 400 to 480° C., or 420 to 450° C. When the maximum temperature is 380° C. or higher, imidization proceeds sufficiently, and a polyimide film adaptable to a high-temperature process can be obtained. When the maximum temperature is 500° C. or lower, thermal deterioration and coloring of the polyimide can be suppressed. The heating time at the maximum temperature is, for example, 10 minutes or more, and the heating time at a temperature of 380° C. or higher may be 10 to 60 minutes. The laminate may be held at any temperature for any period of time until reaching the maximum temperature.

The imidization may be performed in air, under reduced pressure or in an inert gas such as nitrogen. For obtaining a polyimide film having high transparency, heating under reduced pressure or in an inert gas such as nitrogen is preferable. As a heating apparatus, a known apparatus such as a hot-air oven, an infrared oven, a vacuum oven, an inert oven or a hot plate is used. For reducing the heating time and developing the characteristics, the polyamic acid solution containing an imidizing agent and a dehydration catalyst may be heated by the above-described method to perform imidization.

In the batch type process for preparing a device, when stress remains at the interface between the base substrate and the polyimide film formed on the base substrate, warpage may occur in the laminate of the base substrate and the polyimide film, so that the process for forming an element on the laminate is hindered. Thus, it is preferable that stress (internal stress) at the interface in the laminate of the base substrate and the polyimide film is small. Specifically, the internal stress may be −30 MPa or more and 40 MPa or less, −20 MPa or more and 30 MPa or less, or −10 MPa or more and 20 MPa or less. The internal stress is calculated on the basis of a change in warpage (curvature radius) of a glass plate before and after the polyimide film is formed on the glass plate.

When an electronic element is formed on a substrate by the batch process, the element may be formed on a laminate with a polyimide film disposed on a base substrate such as glass, and the base substrate is then peeled from the polyimide film. The element may be formed on the polyimide film peeled from the base substrate.

The method for peeling the polyimide film from the base substrate is not particularly limited. For example, the polyimide film may be peeled manually or with a peeling apparatus such as a drive roll or a robot. Adhesion between the base substrate and the polyimide film may be reduced to perform peeling. For example, a polyimide film may be formed on a base substrate provided with a release layer. Peeling may be promoted by forming a silicon oxide film on a substrate having a large number of grooves, and allowing an etchant to permeate. Peeling may be performed by irradiation with laser light.

When the base substrate and the polyimide are peeled from each other by laser irradiation, it is necessary for the polyimide film to absorb the laser light, and therefore the cutoff wavelength of the polyimide film (wavelength at which the transmittance is 0.1% or less) is required to be longer than the wavelength of laser light to be used for peeling. For example, when a XeCl excimer laser with a wavelength of 308 nm is used, the cutoff wavelength of the polyimide film may be 310 nm or longer, or 320 nm or longer. When a solid-state UV laser having a wavelength of 355 nm is used, the cutoff wavelength of the polyimide film may be 360 nm or longer, or 365 nm or longer.

In general, a polyimide easily absorbs light having a short wavelength, and when the cutoff wavelength shifts toward longer wavelengths, the film may be colored yellow due to absorption of visible light. In the polyimide of one or more embodiments of the present invention, the cutoff wavelength tends to shift to longer wavelengths when the ratio of PMDA in the tetracarboxylic dianhydride components increases. By incorporating PMDA as a tetracarboxylic dianhydride component to the extent that the cutoff wavelength does not reach the visible light region, an UV absorption property suitable for a peeling process with an UV laser can be imparted in addition to transparency and thermal dimensional stability. The cutoff wavelength of the polyimide film may be 390 nm or shorter, 385 nm or shorter, or 380 nm or shorter.

The polyimide film used for transparent flexible substrate is required to have a high transmittance in the entire visible light wavelength region. The light transmittance of the polyimide film for a transparent flexible substrate at a wavelength of 450 nm may be 75% or more, or 80% or more. The light transmittance of the polyimide of one or more embodiments of the present invention, in the form of a film having a thickness of 10 μm, may be in the above-described range.

The transparency of the polyimide film can be evaluated in terms of, for example, a total light transmittance and haze according to JIS K7105-1981. The total light transmittance of the polyimide film may be 80% or more, or 85% or more. The haze of the polyimide film may be 1.2% or less, 1.0% or less, or 0.8% or less. The total light transmittance and the haze of the polyimide of one or more embodiments of the present invention, in the form of a film having a thickness of 10 μm, may be in the above-described range. As described above, the haze of the polyimide film tends to decrease when the tetracarboxylic acid includes BPAF as an anhydride component.

Since the polyimide film is applied to a high-temperature process, the polyimide film may have a high glass transition temperature. Specifically, the glass transition temperature of the polyimide film may be 380° C. or higher, or 400° C. or higher. The glass transition temperature of the polyimide film, which is a temperature at which the loss tangent in dynamic viscoelasticity measurement is maximum, is measured through the method described in examples below. In one or more embodiments, the polyimide film has a small coefficient of thermal expansion (CTE) during heating. The CTE of the polyimide film may be −50 to 100 ppm/K, −30 to 90 ppm/K, or −20 to 80 ppm/K. CTE may be 60 ppm/K or less, 50 ppm/K or less, 40 ppm/K or less or 30 ppm/K or less, and may be −10 ppm/K or more or 0 ppm/K or more. CTE, which is the amount of strain of a sample per unit temperature in the range of 100° C. to 400° C. at the time of heating the polyimide film at a heating rate of 10° C./min, is measured by thermomechanical analysis (TMA) through the method described in examples below.

EXAMPLES

[Evaluation Methods]

Material property values and the like were measured by the following evaluation methods.

<Molecular Weight of Polyamic Acid>

The weight average molecular weight (Mw) was obtained under the conditions shown in Table 1.

TABLE 1

| Item | Condition |
|---|---|
| Apparatus | HLC-8320GPC (manufactured by Tosho Corporation) |
| Column | Shodex GPC KD-806M x 2, each having 8 mmφ × 30 cm, total 60 cm |
| Guard column | Shodex GPC KD-G, 4.6 mmφ × 1 cm |
| Column temperature | 40° C. |
| Eluent | 30 mM-LiBr + 30 mM-phosphoric acid/DMF<br>Flow rate: 0.6 mL/min |
| Injection pressure | about 1.3 to 1.7 MPa |
| Injection volume | 30 μL (solid content concentration of 0.4 wt %) |
| Standard sample | Polyethylene oxide (used for preparation of calibration curve) |
| Detector | RI |
| Order of calibration curve | One dimension |

<Internal Stress>

On an alkali-free glass (thickness: 0.7 mm, size: 100 mm×100 mm) manufactured by Corning Incorporated, whose warpage amount had been measured in advance, a polyimide film was formed in the same manner as in Examples and Comparative Examples to obtain a laminate with a 10 μm-thick polyimide film formed on glass. The laminate was left standing in a desiccator for 10 minutes, and then set in a thin-film stress measuring apparatus ("FLX-2320-S" manufactured by Tencor), and the warpage amount of the laminate was measured in a nitrogen atmosphere at 25° C. The stress generated between the glass substrate and the polyimide film at 25° C. was calculated from the warpage amount.

<Light Transmittance of Polyimide Film>

The light transmittance of the polyimide film at 200 to 800 nm was measured using an ultraviolet visible near-infrared spectrophotometer (V-650) manufactured by JASCO Corporation, and the light transmittance at a wavelength of 450 nm was used as an index of transparency.

<Total Light Transmittance and Haze of Polyimide Film>

Measurement was performed according to a method described in JIS K7105-1981 using an integrating sphere haze meter 300A manufactured by Nippon Denshoku Industries Co., Ltd.

<Glass Transition Temperature of Polyimide Film>

Using DMS6100 manufactured by Hitachi High-Tech Science Corporation, a sample having a width of 9 mm and a length of 10 mm was placed in an air atmosphere, the dynamic viscoelasticity thereof was measured under the following measurement conditions, and a temperature giving the maximum value of loss tangent was defined as a glass transition temperature. The loss tangent is a value obtained by dividing a loss elastic modulus by a storage elastic modulus.

(Measurement Conditions)

Measurement temperature: 0° C. to 550° C.

Heating rate: 3° C./min

Strain amplitude: 10 μm

Minimum tension/compression force: 100 mN

Tension/compression force gain: 1.5

Initial force amplitude value: 100 mN

<Coefficient of Thermal Expansion (CTE) of Polyimide Film>

TMA/SS7100 manufactured by Hitachi High-Tech Science Co., Ltd. was used. A load of 29.4 mN was applied to a sample having a width of 3 mm and a length of 10 mm. Temperature was raised from 10° C. to 450° C. at 10° C./minute to determine coefficients of thermal expansion from amounts of strains at 100-400° C.

[Synthesis of Polyamic Acid]

Example 1

A 2 L glass separable flask equipped with a stirrer having a stainless stirring rod, and a nitrogen inlet tube was charged with 400.00 g of N-methyl-2-pyrrolidone (hereinafter, referred to as NMP) and 54.42 g of TFMB, the mixture was stirred to be dissolved, 25.00 g of BPDA, 16.68 g of PMDA and 3.90 g of BPAF were then sequentially added while the solution was stirred, and the mixture was stirred for 24 hours to obtain a polyamic acid solution. The concentration of the diamine component and the tetracarboxylic dianhydride component in this reaction solution was 20.0 wt % based on the total amount of the reaction solution.

Example 2

To 500 g of a 20.0 wt % polyamic acid solution synthesized in the same manner as in Example 1, 1,2-dimethylimidazole (hereinafter, sometimes referred to as DMI) was added in an amount of 1 g (1 part by weight based on 100 parts by weight of polyamic acid, or 0.03 mole based on 1 mole of amide groups of polyamic acid) to prepare a polyamic acid solution.

Example 3

A polyamic acid solution was obtained by performing polymerization in the same manner as in Example 1 except that the charged amount of the diamine was changed to 54.87 g of TFMB, and the charged amounts of the acid dianhydrides were changed to 25.21 g of BPDA, 17.57 g of PMDA and 2.36 g of BPAF.

Example 4

To 500 g of a polyamic acid solution prepared in the same manner as in Example 3, 1 g of DMI was added to prepare a polyamic acid solution.

Example 5

A polyamic acid solution was obtained by performing polymerization in the same manner as in Example 1 except that the charged amount of the diamine was changed to 55.33 g of TFMB, and the charged amounts of the acid dianhydrides were changed to 25.42 g of BPDA, 18.47 g of PMDA and 0.79 g of BPAF.

Example 6

To 500 g of a polyamic acid solution prepared in the same manner as in Example 5, 1 g of DMI was added to prepare a polyamic acid solution.

Example 7

A polyamic acid solution was obtained by performing polymerization in the same manner as in Example 1 except that the charged amount of the diamine was changed to 53.05 g of TFMB, and the charged amounts of the acid dianhydrides were changed to 34.11 g of BPDA, 9.03 g of PMDA and 3.80 g of BPAF.

Example 8

To 500 g of a polyamic acid solution prepared in the same manner as in Example 7, 1 g of DMI was added to prepare a polyamic acid solution.

Example 9

A polyamic acid solution was obtained by performing polymerization in the same manner as in Example 1 except that the charged amount of the diamine was changed to 53.48 g of TFMB, and the charged amounts of the acid dianhydrides were changed to 34.39 g of BPDA, 9.84 g of PMDA and 2.30 g of BPAF.

Example 10

To 500 g of a polyamic acid solution prepared in the same manner as in Example 9, 1 g of DMI was added to prepare a polyamic acid solution.

Example 11

A polyamic acid solution was obtained by performing polymerization in the same manner as in Example 1 except that the charged amount of the diamine was changed to 52.44 g of TFMB, and the charged amounts of the acid dianhydrides were changed to 45.77 g of BPDA and 1.79 g of BPAF. To 500 g of this polyamic acid solution, 1 g of DMI was added to prepare a polyamic acid solution.

Comparative Example 1

A 2 L glass separable flask equipped with a stirrer having a stainless stirring rod, and a nitrogen inlet tube was charged with 400.00 g of NMP and 55.56 g of TFMB, the mixture was stirred to be dissolved, 25.52 g of BPDA and 18.92 g of PMDA were then sequentially added while the solution was stirred, and the mixture was stirred for 24 hours to obtain a polyamic acid solution.

Comparative Example 2

A polyamic acid solution was obtained by performing polymerization in the same manner as in Comparative Example 1 except that the charged amount of TFMB was changed to 54.13 g, and the charged amounts of the acid dianhydrides were changed to 34.81 g of BPDA and 11.06 g of PMDA.

Comparative Example 3

To 500 g of a polyamic acid solution prepared in the same manner as in Comparative Example 2, 1 g of DMI was added to prepare a polyamic acid solution.

[Preparation of Polyimide Film]

Each of the polyamic acid solutions obtained in Examples and Comparative Examples was diluted to a polyamic acid concentration of 10.0 wt % by adding NMP. Using a spin coater, the polyamic acid solution was applied onto a 150 mm×150 mm square alkali-free glass plate (Eagle XG, manufactured by Corning Incorporated, thickness: 0.7 mm) so as to have a thickness of 10 μm after drying, and dried in a hot-air oven at 80° C. for 30 minutes to form a polyamic acid film. In a nitrogen atmosphere, the film was heated from 20° C. to 350° C. at a heating rate of 5° C./min, held at 350° C. for 30 minutes, heated to 420° C. at 5° C./min, and then heated at 420° C. for 30 minutes to perform imidization, thereby obtaining a laminate of a 10 μm-thick polyimide film and glass. The polyimide film was peeled from the glass base substrate of the obtained laminate, and characteristics were evaluated.

Table 2 shows the compositions of the polyamic acid solutions, the molecular weights of polyamic acids, and results of evaluating the polyimide films in Examples and Comparative Examples. In the compositions in Table 2, each of the total of tetracarboxylic dianhydrides and the total of diamines is 100 mol %. The addition amount of imidazole is based on 100 parts by weight of the polyamic acid (resin content).

TABLE 2

| | Polyamic acid: Dianhydride (mol %) BPDA | PMDA | BPAF | Diamine (mol %) TFMB | Molecular weight (Mw) | Imidazole compound kind | Amount (wt. part) | Polyimide film: transparency: Light transmittance @ 450 nm (%) | Total transmittance (%) | Haze (%) | Tg (° C.) | CTE (ppm/K) | Internal stress (MPa) |
|---|---|---|---|---|---|---|---|---|---|---|---|---|---|
| Example1 | 50 | 45 | 5 | 100 | 120,000 | | — | 77 | 88 | 0.4 | 410 | 55 | 12 |
| Example2 | 50 | 45 | 5 | 100 | 120,000 | DMI | 1 | 78 | 88 | 0.4 | 410 | 20 | 10 |
| Example3 | 50 | 47 | 3 | 100 | 103,000 | | — | 77 | 88 | 0.4 | 410 | 52 | 12 |
| Example4 | 50 | 47 | 3 | 100 | 103,000 | DMI | 1 | 78 | 88 | 0.4 | 410 | 18 | 9 |
| Example5 | 50 | 49 | 1 | 100 | 115,000 | | — | 77 | 88 | 0.4 | 410 | 50 | 12 |
| Example6 | 50 | 49 | 1 | 100 | 115,000 | DMI | 1 | 78 | 88 | 0.4 | 410 | 18 | 9 |
| Example7 | 70 | 25 | 5 | 100 | 140,000 | | — | 79 | 88 | 0.4 | 390 | 65 | 18 |
| Example8 | 70 | 25 | 5 | 100 | 140,000 | DMI | 1 | 80 | 88 | 0.4 | 400 | 45 | 12 |
| Example9 | 70 | 27 | 3 | 100 | 130,000 | | — | 79 | 88 | 0.4 | 390 | 60 | 18 |
| Example10 | 70 | 27 | 3 | 100 | 130,000 | DMI | 1 | 80 | 88 | 0.4 | 400 | 42 | 12 |

TABLE 2-continued

| | Polyamic acid | | | | | Imidazole compound | | Polyimide film | | | | | | |
|---|---|---|---|---|---|---|---|---|---|---|---|---|---|---|
| | | | | | | | | transparency | | | | | | |
| | Dianhydride (mol %) | | | Diamine (mol %) | Molecular weight | | Amount | Light transmittance @ 450 nm | Total transmittance | Haze | Tg | CTE | Internal stress |
| | BPDA | PMDA | BPAF | TFMB | (Mw) | kind | (wt. part) | (%) | (%) | (%) | (° C.) | (ppm/K) | (MPa) |
| Example11 | 95 | — | 5 | 100 | 130,000 | DMI | 1 | 82 | 89 | 0.3 | 390 | 78 | 15 |
| Comparative Example1 | 50 | 50 | — | 100 | 90,000 | | — | 70 | 86 | 6.5 | 380 | 350 | 20 |
| Comparative Example2 | 70 | 30 | — | 100 | 130,000 | | — | 70 | 85 | 12.0 | 370 | 420 | 30 |
| Comparative Example3 | 70 | 30 | — | 100 | 130,000 | DMI | 1 | 70 | 85 | 8.5 | 370 | 400 | 25 |

The polyimide films of Comparative Examples 1 to 3, which did not contain BPAF as a tetracarboxylic dianhydride component, had a high haze, poor transparency, large CTE and poor thermal dimensional stability. The polyimide films of Examples, which contained BPAF as a tetracarboxylic dianhydride component, had high transparency and thermal dimensional stability with a haze of 0.4% or less and a CTE of less than 80 ppm/K.

In Examples 1, 3 and 5, the CTE tended to increase as the ratio of BPAF in the tetracarboxylic dianhydride increased. On the other hand, in Comparative Example 1 where BPAF was not contained, there was a significant increase in CTE and a decrease in transparency as compared to Examples 1, 3, and 5. Comparison of Examples 7 and 9 with Comparative Example 2 showed the same tendency. These results indicate that incorporation of a small amount of BPAF in addition to BPDA and PMDA as tetracarboxylic dianhydrides causes a change in intramolecular and/or intermolecular interactions of the polymer, resulting in exhibition of high transparency and thermal dimensional stability.

In Example 11 where BPDA and BPAF were used as tetracarboxylic dianhydrides, the polyimide film exhibited excellent thermal dimensional stability and transparency as in other examples.

In Examples 2, 4, 6, 8, 10 and 11 where thermal imidization was performed using a polyamic acid solution containing imidazole compound, CTE decreased while higher transparency (lower haze) was maintained as compared to cases where imidazole compound was not used. These results show that addition of a small amount of imidazole compound to the polyamic acid solution is useful for preparation of a polyimide film excellent in transparency and thermal dimensional stability.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A polyamic acid which is a polyaddition reaction product of a diamine and a tetracarboxylic dianhydride, wherein:

the diamine comprises 2,2'-bistrifluoromethylbenzidine, the tetracarboxylic dianhydride comprises 3,3',4,4'-biphenyltetracarboxylic dianhydride and 9,9'-(3,4'-dicarboxyphenyl)fluorenic dianhydride, the 9,9'-(3,4'-dicarboxyphenyl)fluorenic dianhydride is comprised in an amount of 0.5 mol % or more and 10 mol % or less based on a total amount of the tetracarboxylic anhydride, and an amount of the 2,2'-bistrifluoromethylbenzidine based on a total amount of the diamine is 90 mol % or more.

2. A polyamic acid which is a polyaddition reaction product of a diamine and a tetracarboxylic dianhydride, wherein:

the diamine comprises 2,2'-bistrifluoromethylbenzidine, the tetracarboxylic dianhydride comprises 3,3',4,4'-biphenyltetracarboxylic dianhydride and 9,9'-(3,4'-dicarboxyphenyl)fluorenic dianhydride, the 9,9'-(3,4'-dicarboxyphenyl)fluorenic dianhydride is comprised in an amount of 0.5 mol % or more and 10 mol % or less based on a total amount of the tetracarboxylic anhydride, the tetracarboxylic dianhydride further comprises pyromellitic anhydride, and the pyromellitic anhydride is comprised in an amount of 10 mol % or more and 50 mol % or less based on the total amount of the tetracarboxylic anhydrides.

3. A polyamic acid solution comprising:

the polyamic acid according to claim 2; and an organic solvent.

4. The polyamic acid solution according to claim 3, further comprising an imidazole compound.

5. The polyamic acid solution according to claim 4, wherein a content of the imidazole compound is 0.10 mole or less based on 1 mole of an amide group of the polyamic acid.

6. A polyimide which is a polycondensation reaction product of a diamine and tetracarboxylic dianhydride, wherein:

the diamine comprises 2,2'-bistrifluoromethylbenzidine, the tetracarboxylic dianhydride comprises 3,3',4,4'-biphenyltetracarboxylic dianhydride, and 9,9'-(3,4'-dicarboxyphenyl)fluorenic dianhydride, the 9,9'-(3,4'-dicarboxyphenyl)fluorenic dianhydride is comprised in an amount of 0.5 mol % or more and 10 mol % or less based on a total amount of the tetracarboxylic anhydrides, and an amount of the 2,2'-bistrifluoromethylbenzidine based on a total amount of the diamine is 90 mol % or more.

7. A polyimide which is a polycondensation reaction product of a diamine and tetracarboxylic dianhydride, wherein:

the diamine comprises 2,2'-bistrifluoromethylbenzidine, the tetracarboxylic dianhydride comprises 3,3',4,4'-biphenyltetracarboxylic dianhydride, and 9,9'-(3,4'-dicarboxyphenyl)fluorenic dianhydride, the 9,9'-(3,4'-dicarboxyphenyl)fluorenic dianhydride is comprised in an amount of 0.5 mol % or more and 10 mol % or less based on a total amount of the tetracarboxylic anhydrides, the tetracarboxylic dianhydride further comprises pyromellitic anhydride, and the pyromellitic anhydride is comprised in an amount of 10 mol % or more and 50 mol % or less based on the total amount of the tetracarboxylic anhydrides.

8. A polyimide film comprising the polyimide according to claim 7.

9. The polyimide film according to claim 8, wherein the polyimide film has a glass transition temperature of 380° C. or higher, and wherein the polyimide film has a coefficient of thermal expansion during heating from 100° C. to 400° C. of 100 ppm/K or less.

10. The polyimide film according to claim 8, wherein the polyimide film has a light transmittance at a wavelength of 450 nm of 75% or more, and wherein the polyimide film has a haze of 1.2% or less.

11. A laminate comprising:

a base substrate, wherein the polyimide film according to claim 8 is disposed on the base substrate.

12. A flexible device comprising:

the polyimide film according to claim 8; and an electronic element disposed on the polyimide film.

13. A method for producing a polyimide film comprising:

coating a base substrate with the polyamic acid solution according to claim 3 to form a laminate in which a film-shaped polyamic acid is disposed on the base substrate; and heating the laminate to imidize the polyamic acid.

14. The method for producing the polyimide film according to claim 13, wherein the laminate is heated at a temperature in a range of 380° C. or higher and 500° C. or lower for an amount of time ranging from 10 minutes or more to 60 minutes or less.

15. A method for producing a polyimide film comprising:

forming the polyimide film by the method according to claim 13; and peeling the base substrate and the polyimide film from each other.

16. The method for producing the polyimide film according to claim 15, wherein the base substrate and the polyimide film are peeled from each other by laser irradiation.

* * * * *